US010645813B2

(12) United States Patent
Rawlings et al.

(10) Patent No.: US 10,645,813 B2
(45) Date of Patent: May 5, 2020

(54) ZERO-MISALIGNMENT VIA-PAD STRUCTURES

(71) Applicant: Intel Corporation, Santa Clara, CA (US)

(72) Inventors: Brandon M. Rawlings, Chandler, AZ (US); Henning Braunisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/230,977

(22) Filed: Dec. 21, 2018

(65) Prior Publication Data

US 2019/0150291 A1 May 16, 2019

Related U.S. Application Data

(60) Continuation of application No. 15/621,403, filed on Jun. 13, 2017, now Pat. No. 10,187,998, which is a
(Continued)

(51) Int. Cl.
*H05K 1/11* (2006.01)
*H05K 3/00* (2006.01)
(Continued)

(52) U.S. Cl.
CPC ......... *H05K 3/0082* (2013.01); *H05K 3/4647* (2013.01); *H05K 3/4679* (2013.01);
(Continued)

(58) Field of Classification Search
CPC ......... H05K 1/112; H05K 1/113; H05K 1/114
See application file for complete search history.

(56) References Cited

U.S. PATENT DOCUMENTS 3,868,724 A * 2/1975 Perrino ............... H01L 23/3121
257/668
8,115,300 B2 2/2012 Muramatsu et al.
(Continued)

FOREIGN PATENT DOCUMENTS

TW 200803673 1/2008
TW 201438059 10/2014

OTHER PUBLICATIONS

Hinsberg, William D. et al., "Zero-Misalignment Lithographic Process using a Photoresist with Wavelength-Selected Tone," SPIE, vol. 920 Advances in Resist Technology and Processing V (1988); downloaded from: http://proceedings.spiedigitallibrary.org/ on Aug. 18, 2014, 11 pages.

(Continued)

*Primary Examiner* — Jeremy C Norris
(74) *Attorney, Agent, or Firm* — Schwabe, Williamson & Wyatt, P.C.

(57) ABSTRACT

A photoresist is deposited on a seed layer on a substrate. A first region of the photoresist is removed to expose a first portion of the seed layer to form a via-pad structure. A first conductive layer is deposited onto the first portion of the seed layer. A second region of the photoresist adjacent to the first region is removed to expose a second portion of the seed layer to form a line. A second conductive layer is deposited onto the first conductive layer and the second portion of the seed layer.

11 Claims, 7 Drawing Sheets

Related U.S. Application Data division of application No. 14/576,107, filed on Dec. 18, 2014, now Pat. No. 9,713,264.

(51) Int. Cl.
  *H05K 3/46* (2006.01)
  *H05K 3/42* (2006.01)

(52) U.S. Cl.
  CPC .............. *H05K 1/116* (2013.01); *H05K 3/422* (2013.01); *H05K 3/424* (2013.01); *H05K 2201/09463* (2013.01); *H05K 2201/09854* (2013.01); *H05K 2203/0505* (2013.01)

(56) References Cited

U.S. PATENT DOCUMENTS

| 9,035,468 | B2 | 5/2015 | Shih |
|---|---|---|---|
| 2005/0017161 | A1 | 1/2005 | Grier et al. |
| 2009/0166888 | A1 | 7/2009 | Pozder |
| 2014/0124877 | A1 | 5/2014 | Sun |
| 2016/0004160 | A1 | 1/2016 | Tagawa et al. |

OTHER PUBLICATIONS

01, Kiyoshi, et al., "Development of New 2.5D Package with Novel Integrated Organic Interposer Substrate with Ultra-fine Wring and High Density Bumps," 2014 IEEE, 2014 Electronic Components & Technology Conference, 6 pages.

Shimizu, Noriyoshi, et al., "Development of Organic Multi Chip Package for High Performance Application," 45th International Symposium on Microelectronics (IMAPS 2013) Sep. 30-Oct. 3, 2013, Orlando, FL USA, 6 pages.

Taiwan Search Report from Taiwan Patent App. No. 104137881 dated Aug. 17, 2017, 2 pgs.

Non-Final Office Action from U.S. Appl. No. 14/576,107 dated Nov. 18, 2016, 5 pgs.

* cited by examiner

ZERO-MISALIGNMENT VIA-PAD STRUCTURES

This application is a continuation of U.S. patent application Ser. No. 15/621,403 filed Jun. 13, 2017, which is a divisional of U.S. application Ser. No. 14/576,107 filed on Dec. 18, 2014, now U.S. Pat. No. 9,713,264 issued Jul. 18, 2017, the entire contents of which are hereby incorporated by reference herein.

FIELD

Embodiments as described herein relate to a field of electronic device manufacturing, and in particular, to an electronic device packaging.

BACKGROUND

Currently, conventional electronic device packaging methods are reaching their limits, as the demands for miniaturization and higher density of devices continue to increase. Generally, multi-chip packaging refers to an electronic packaging where multiple integrated circuits (ICs), semiconductor dies, or other discrete components are packaged onto a unifying substrate.

Generally, the substrate of a package comprises a plurality of metal layers separated by dielectric layers. Conductive vias are used to provide electrical connections between the metal layers. Typically, a metal via is formed on a metal pad deposited on a substrate layer using a laser drilling or an etching technique. The minimum size of the pad needs to be substantially greater than the size of the via to accommodate for misalignment. Standard packaging techniques, for example, provide 49 micron (μm) diameter, laser-drilled vias on large 77 μm diameter pads to accommodate for the ±14 μm misalignment.

Currently, via-pad structures are formed using registration of either laser drilling or a lithographic mask defining the via to existing fiducials on a pad layer of the substrate. However, due to shrinkage during curing of the dielectric layer deposited on the pad layer of the substrate and shifting the pad with respect to the fiducials, the via-to-pad registration is not preserved across the field of the substrate layer. The via-pad misalignment may cause device failures, decrease yield and increase manufacturing cost. Additionally, the large size of the pads, and the reduced via registration capability limit the density of metal lines and other components on the substrate.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Figure 1:
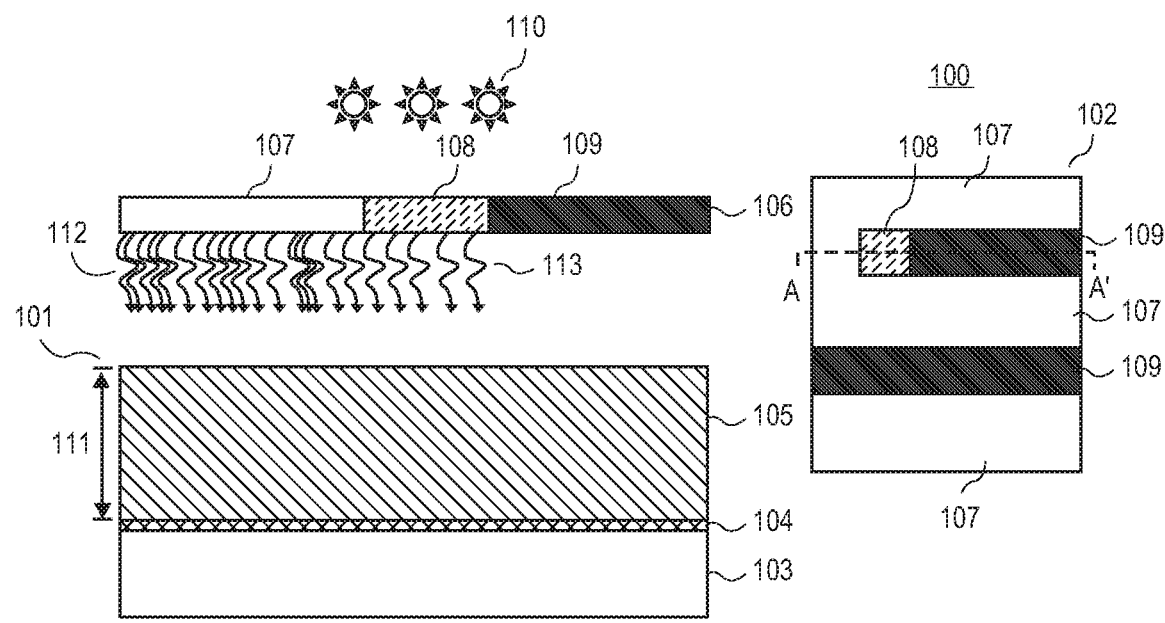
FIG. 1 shows a side view and a top view of a portion of an apparatus to provide an electronic device package according to one embodiment.

Methods and apparatuses to provide zero-misalignment via-pad structures are described. Embodiments described herein advantageously use a dual-tone photoresist for additive and semi-additive metallization processes and packaging applications (e.g., creation of microvias, other packaging applications).

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

In one embodiment, a photoresist is deposited on a seed layer on a substrate. A first region of the photoresist is removed to expose a first portion of the seed layer to form a via-pad structure. A first conductive layer is deposited onto the first portion of the seed layer. A second region of the photoresist adjacent to the first region is removed to expose a second portion of the seed layer to form a line, the dimensions of which are constrained by a remaining third portion of photoresist. A second conductive layer is deposited onto the first conductive layer and the second portion of the seed layer.

Embodiments of zero-misalignment via-pad structures as described herein advantageously reduce the via-pad sizes in substrate layers, thereby increasing the attainable line density in routing layers of a microelectronic package. In one embodiment, by using a dual-tone photoresist, the via-pad registration is advantageously defined by the alignment of two layers on a photomask. Because the photomask is rigid, substantially planar, and can be made using methods that are more precise than the standard via-pad registration methods, via-pad misalignment can be very small compared to the size of the vias and pads ("zero-misalignment"), so that the size of pads can be reduced to the size as small as the size of the vias. Reducing the pad sizes advantageously increases the density of the metal lines and other components on the substrate. For example, in the context of escape routing for high-bandwidth input/output (IO) connections, reducing the pad sizes increases the maximum realizable density of IO connections (IO/mm). Typically, using a thin, photodefinable dielectric allows forming 10 μm diameter photo-vias on 25 μm diameter pads leading to density of IO connections to be about 100-120 IO/mm/layer.

Manufacturing zero-misalignment via-pad structures as described herein substantially decreases the via and pad sizes while increasing achievable density such as IO connections/mm/layer. Typically, existing packaging techniques use a silicon interposer or silicon bridge. The use of the silicon interposer increases manufacturing cost, results in large z-height of the package and poor electrical performance for off-package IO connections. The use of the silicon bridge typically results in limited scalability in terms of bump pitch and routing area for the package. Embodiments to provide zero-misalignment via-pad structures as described herein advantageously enable 2.5D packaging, e.g., co-packaging at least two of a central processing unit (CPU), a memory, and a graphics processing unit (GPU); die splitting, quasi-monolithic integration, and other 2.5D packaging techniques that may not need to use a silicon interposer or silicon bridge, thereby reducing the manufacturing cost, decreasing the z-height, increasing the electrical performance and the scalability comparing with the existing packaging techniques.

FIG. 1 shows a side view 101 and a top view 102 of an apparatus 100 to manufacture an electronic device package according to one embodiment. View 101 is a cross-sectional view of the apparatus 100 along an axis A-A'. Apparatus 100 comprises a photoresist 105 on a seed layer 104 on a substrate 103. In one embodiment, substrate 103 is an organic substrate. In one embodiment, substrate 103 comprises Ajinomoto Buildup Film (ABF), liquid crystal polymer, benzocyclobutene (BCB), polyimide, prepreg (a weaved fiber network "preimpregnated" into an epoxy matrix), epoxy, or any combination thereof. In one embodiment, substrate 103 comprises inorganic fillers, such as silica. In alternative embodiment substrate 103 comprises organic, ceramic, glass, semiconductor, e.g., silicon, III-V, or any combination thereof materials. In one embodiment, substrate 103 is a multi-chip package substrate. In one embodiment, substrate 103 is a System-in-Package (SiP) substrate. In another embodiment, substrate is an interposer substrate.

Implementations of the invention may be formed or carried out on a substrate, e.g., an organic, a ceramic, a glass, and a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments of the present invention.

In one embodiment, the substrate 103 includes metallization interconnect layers for integrated circuits. In one embodiment, the substrate 103 includes electronic devices, e.g., transistors, memories, capacitors, inductors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 103 includes interconnects, for example, vias, configured to connect the metallization layers.

In one embodiment, seed layer 104 is a conductive seed layer. Examples of the conductive materials that may be used for the seed layer include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In more specific embodiment, the seed layer 104 is a copper layer.

In one embodiment, the thickness of the seed layer 104 is less than about 200 nanometers (nm). In one embodiment, the thickness of the seed layer is from about 1 nm to about 150 nm. In more specific embodiment, the thickness of the seed layer is about 100 nm. The seed layer 104 can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

In one embodiment, photoresist 105 is a dual-tone photoresist. Generally, the dual-tone photoresist allows printing of two images in a single exposure of a single mask. In one embodiment, dual-tone photoresist 105 comprises materials that react differently to different light wavelengths, different light intensities, or both. In one embodiment, photoresist 105 is a dual-tone, wavelength selective photoresist. In another embodiment, photoresist 105 is a dual-tone, dose selective photoresist. In one embodiment, photoresist 105 contains a bis-azide added to a positive-tone resist containing a diazoketone dissolution inhibitor. In another embodiment, photoresist 105 comprises a positive photosensitizer, a negative photosensitizer, a polymeric matrix resin, or any combination thereof. In another embodiment, photoresist 105 comprises a photo-acid and/or photo-base generator and a chemically amplified photoresist.

In one embodiment, photoresist 105 is deposited using a dry film process. In another embodiment, photoresist 105 is deposited by application of a solution using for example, a spin-coating, a slit-coating, a spray-coating, or any other coating technique, or any other photoresist depositing techniques known to one of ordinary skill in the art of electronic device manufacturing. In one embodiment, a thickness 111 of photoresist 105 is determined by the sum of the pad height and the via height. In one embodiment, the thickness 111 is at least the same as the sum of the pad height and the via height. In one embodiment, thickness 111 is from about 0.5 µm to about 8 µm. In more specific embodiment, thickness 111 is from about 2 µm to about 6 µm.

Photoresist 105 is patterned to form metal features on substrate 103. Generally, a semi-additive metallization process involves forming a photoresist mask that defines the regions of a substrate on which metal features are formed later on in a process.

As shown in FIG. 1, photoresist 105 is exposed to a light 110 through a photomask 106 to pattern at least two images at a time. In one embodiment, light 110 travels to photomask 106 by way of a series of optical elements. In one embodiment, the image formed by the passage of light through photomask 106 is projected onto the photoresist by way of a series of optical elements. In one embodiment, the size of the projected field and the images thereon is reduced or magnified in size compared to the mask field. In one embodiment, light 110 is generated by a broadband light source. In yet another embodiment, light 110 is generated by a plurality of single wavelength light sources. Photomask 106 comprises at least three regions, e.g., a region 107, a region 108, and a region 109.

In one embodiment, light source 110 comprises multiple wavelengths in an approximate range from about 300 nm to about 450 nm. In another embodiment, light 110 comprises multiple wavelengths in other wavelength ranges. As shown in FIG. 1, different portions of the photomask 106 transmit different portions of the light 110. Region 107 transmits a portion 112 of light 110, region 108 transmits a portion 113 of light 110, and region 109 is opaque to light 110. In one embodiment, region 107 is transparent to light 110, region 109 is opaque to light 110, and region 108 transmits a portion of the light 110.

In one embodiment, photomask 106 is a dichromatic (wavelength-filtering) mask having regions, e.g., regions 107, 108, 109, that are transparent to different wavelengths. In this case, region 107 transmits portion 112 (e.g., a group of wavelengths λ that are greater than λ1 and smaller than λ2) and blocks other wavelengths of light 110, region 108 transmits portion 113 (e.g., a group of wavelengths λ that are greater than λ3 and smaller than λ4) and blocks other wavelengths of light 110, and region 109 is opaque to light 110.

In another embodiment, photomask 106 is a grayscale mask, so that different regions of the photomask transmit different doses of light. For example, region 107 transmits portion 112 (e.g., a first intensity or dose of light 110), region 108 transmits portion 113 (e.g., a second intensity or dose of light 110), and region 109 is opaque to light 110. In one embodiment, region 107 is transparent to light 110, region 109 is opaque to light 110, and region 108 transmits only a portion of the light 110.

Typically, the materials for the photomask mask 106 are selected based on the optical properties. In one embodiment, photomask 106 comprises fused silica, glass, chromium, a polymer, or any combination thereof. In more specific embodiment, region 107 comprises fused silica, region 109 comprises chromium, and region 108 comprises a polymer, a multilayer dielectric interference filter, a spin-on glass of inorganic oxide, or any combination thereof.

Figure 2:
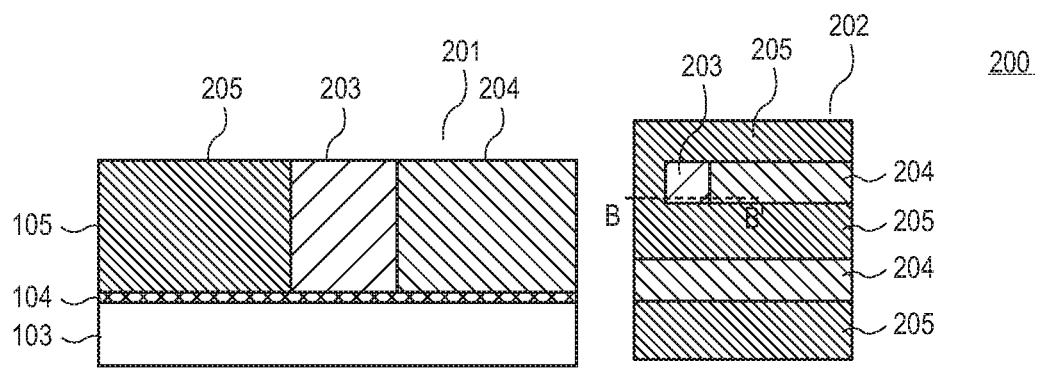
FIG. 2 is a view similar to FIG. 1, after a photoresist is exposed to light according to one embodiment.

FIG. 2 is a view similar to FIG. 1, after the photoresist is exposed to the light according to one embodiment. A view 201 is a cross-sectional view along an axis B-B' and a view 202 is a top view of an apparatus 200. Following exposure to the light through the photomask 106, the photoresist 105 undergoes chemical responses that vary according to the exposure in the various regions of the resist. As shown in views 201 and 202, after the exposure, at least three 2D regions in the photoresist 105 are created, e.g., a region 203, a region 204 and a region 205.

As shown in top view 202, region 203 represents a 2D image of a first feature (e.g., a via, or any other feature) to be formed on substrate 103; region 204 represents a 2D image of a second feature (e.g., a line, or any other feature adjacent to the first feature) to be formed on substrate 103, together with a third feature (e.g., a line, or other feature spaced apart from at least one of the first feature and the second feature) to be formed on substrate 103. Region 205 is used to protect portions of the seed layer 104 on substrate 103 from exposure. That is, at least two images of the features are created at the same time. Generally, how many patterned regions, such as regions 203, 204 and 205, are created is determined by the photoresist chemistry. In alternative embodiments, additional regions in addition to regions 203, 204 and 205 are created to pattern more than two images at a time.

Each of the created regions has been exposed to different light (e.g., different combinations of wavelengths, different light doses). In one non-limiting example, region 203 has been exposed to a range of wavelengths λ such that λ3<λ<λ4, region 204 has not been exposed to light, and region 205 has been exposed to a range of wavelengths λ such that λ1<λ<λ2. In another non-limiting example, region 203 has been exposed to light having one intensity or dose; region 204 has not been exposed to light, region 205 has been exposed to light having an intensity or dose different from the intensity or dose of the light to which region 203 has been exposed. In one non-limiting example, a region 203 is a base-soluble portion of the photoresist; region 204 is an unexposed portion of the photoresist and region 205 is a cross-linked portion of the photoresist.

Each of the regions 203, 204 and 205 can be removed later on in a process independent from each other. In one embodiment, each of the regions 203, 204 and 205 is removed selectively by using an etching technique later on in a process. In one embodiment, region 203 becomes soluble in an aqueous basic developer solution, while other regions (e.g., regions 204 and 205) remain insoluble, either due to a presence of a dissolution inhibitor (e.g., region 204, which is unexposed) or due to cross-linking (e.g., region 205).

Figure 3:
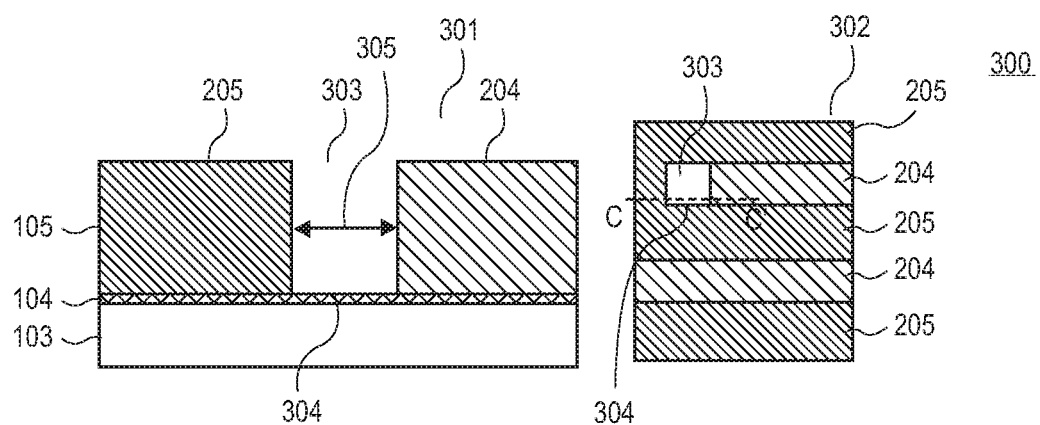
FIG. 3 is a view similar to FIG. 2, after a first region of the photoresist is removed to expose a portion of a seed layer to form one or more first features according to one embodiment.

FIG. 3 is a view similar to FIG. 2, after a first region of the photoresist is removed to expose a portion of the seed layer to form one or more first features according to one embodiment. The "first region" here refers to a subset of a total area, but not necessarily a connected subset. FIG. 3 shows a view 301 which is a cross-sectional view along an axis C-C' and a view 302 which is a top view of an apparatus 300. In one embodiment, the one or more first features comprise a via-pad structure. As shown in FIG. 3, the soluble region 203 is selectively removed to form one or more openings, e.g., an opening 303, to expose one or more portions of the seed layer 104, e.g., a portion 304, while leaving regions 204 and 205 intact to form one or more via-pad structures later on in a process. Opening 303 can have a circular, oval, elliptical, square, rectangular, or any other shape.

In one embodiment, region 203 is selectively removed by dissolution in an aqueous basic developer solution, while leaving regions 204 and 205 intact. In alternative embodiments, region 203 is selectively removed using other photoresist removal techniques known to one of ordinary skill in the art of electronic device manufacturing. In one embodiment, a size 305 of the opening 303 is from about 0.5 μm to about 4 μm. In more specific embodiment, size 305 is from about 2 μm to about 3 μm.

Figure 4:
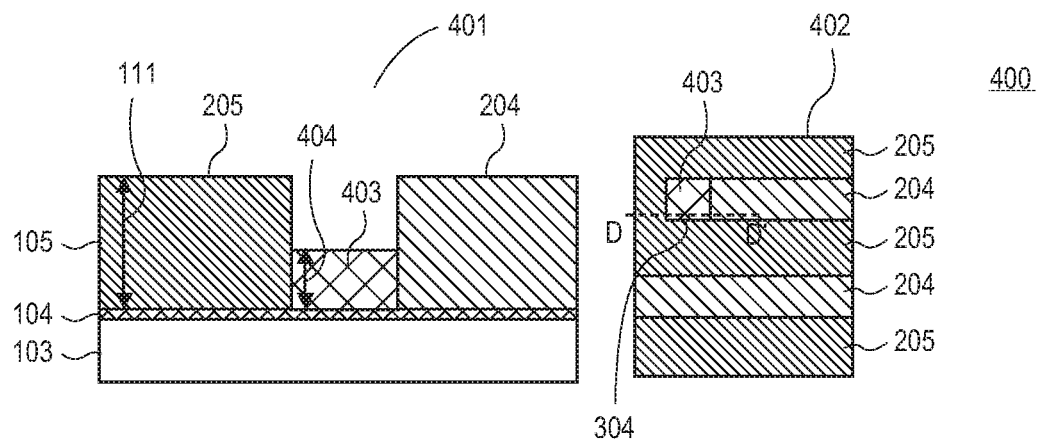
FIG. 4 is a view similar to FIG. 3, after a first conductive layer is deposited onto one or more exposed portions of the seed layer according to one embodiment.

FIG. 4 is a view similar to FIG. 3, after a conductive layer is deposited onto the one or more exposed portions of the seed layer according to one embodiment. A view 401 is a cross-sectional view along an axis D-D' and a view 402 is a top view of an apparatus 400. In one embodiment, a conductive layer 403 is a part of a via-pad structure. Examples of the conductive materials that may be used for the conductive layer include, but are not limited to, metals, e.g., copper, tungsten, tantalum, titanium, hafnium, zirconium, aluminum, silver, tin, lead, metal alloys, metal carbides (e.g., hafnium carbide, zirconium carbide, titanium carbide, tantalum carbide, aluminum carbide), other conductive materials, or any combination thereof. In more specific embodiment, the conductive layer 403 is a copper layer. In one embodiment, a thickness 404 of the conductive layer 403 is determined by both the height of the via and the thickness of a conductive line adjacent to the via. In one embodiment, thickness 404 is smaller than the thickness 111 of the photoresist 105. In one embodiment, thickness 404 corresponds to a difference between the height of the via and the thickness of the metal line adjacent to the via. In one embodiment, thickness 404 is less than about 6 μm. In one embodiment, the thickness 404 is from about 0.5 μm to about 4 μm. In more specific embodiment, thickness 404 is from about 1 μm to about 2 μm.

As shown in FIG. 4, conductive layer 403 is deposited while leaving portions 205 and 204 of the photoresist 105 intact. In one embodiment, conductive layer 403 is deposited using one of electroplating techniques known to one of ordinary skill in the art of electronic device manufacturing. In more specific embodiment, conductive layer 403 is deposited by an electrolytic plating technique at conditions such that the electrolytic plating does not dissolve any of the remaining portions 204 and 205 of the photoresist, e.g., a solution of copper (II) sulfate and sulfuric acid at room temperature, used for depositing copper. In alternative embodiments, conductive layer 403 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

Figure 5:
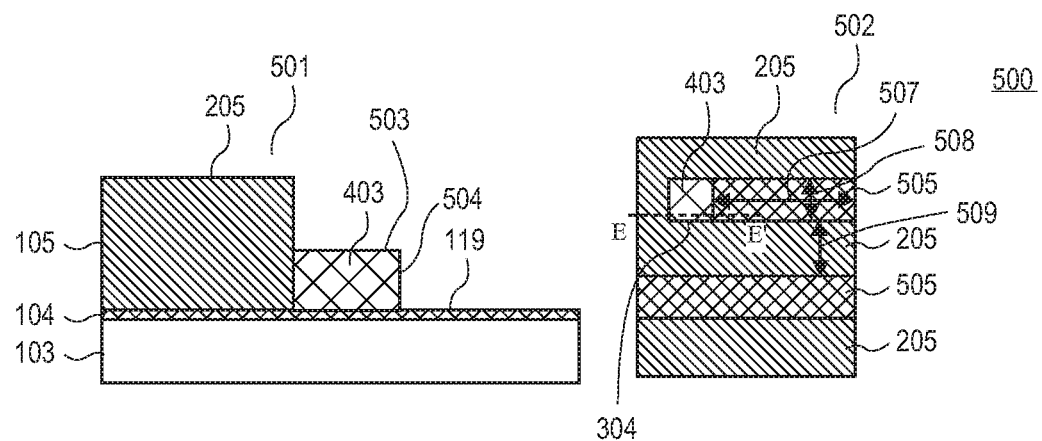
FIG. 5 is a view similar to FIG. 4, after a second region of the photoresist is removed to expose one or more portions of the seed layer to form one or more second features according to one embodiment.

FIG. 5 is a view similar to FIG. 4, after a second region of the photoresist is removed to expose one or more portions of the seed layer to form one or more second features according to one embodiment. In one embodiment, the one or more second features comprise a conductive line. A view 501 is a cross-sectional view along an axis E-E' and a view 502 is a top view of an apparatus 500. As shown in FIG. 5, the region corresponding to region 204 in FIG. 4 is selectively removed to form one or more open regions, such as open region 505 to expose one or more portions, such as a portion 119 of the seed layer 104 while leaving region 205 of the photoresist 105 and conductive layer 403 intact. As shown in FIG. 5, conductive layer 403 is bounded by a top surface 503 and a sidewall surface 504. Sidewall surface 504 is exposed by removal of the region 204 of the photoresist 105. In one embodiment, region 204 is selectively removed by dissolution in an appropriate solvent that is not a solvent for other remaining photoresist portions, such as portion 205. For example, unexposed region 204 is removed by dissolution in a solvent, e.g., propylene glycol monomethyl ether acetate, a cyclic ketone such as cyclohexanone, or N-methyl-2-pyrrolidone, while leaving cross-linked region 205 intact. In one embodiment, the region 204 is removed directly after conductive layer 403 is deposited. In another embodiment, the region 204 is treated with an additional exposure, e.g., a flood exposure, heating, or contact with a chemical (which can include the chemicals used during electrolytic plating of the conductive layer 403), to effect a change in the solubility and improve solubility selectivity. In a more specific embodiment, the treated region is removed by dissolution in an organic solvent or, in another embodiment, by dissolution by an aqueous base solution. In one embodiment, the additional treatment of the region 204 is performed before electrolytic plating of the conductive layer. In another embodiment, the additional treatment of the region 204 is performed during electrolytic plating of the conductive layer. In yet another embodiment, the additional treatment of the region 204 is performed after electrolytic plating of the conductive layer.

In alternative embodiments, region 204 is selectively removed using other photoresist removal techniques known to one of ordinary skill in the art of electronic device manufacturing. In one embodiment, the width of the openings, such as a width 507 is determined by design, e.g., by the width of the conductive line formed later on in a process. In one embodiment, the width 507 is from about 0.5 μm to about 4 μm. In more specific embodiment, width 507 is from about 2 μm to about 3 μm. In one embodiment, the length of the opening, such as a length 508 is determined by design, e.g., by the length of the conductive line formed later on in a process. As shown in FIG. 5, portions of an open region 505 are separated by a spacing 509. In one embodiment, spacing 509 is from about 0.5 µm to about 4 µm. In more specific embodiment, spacing 509 is from about 2 µm to about 3 µm.

Figure 6:
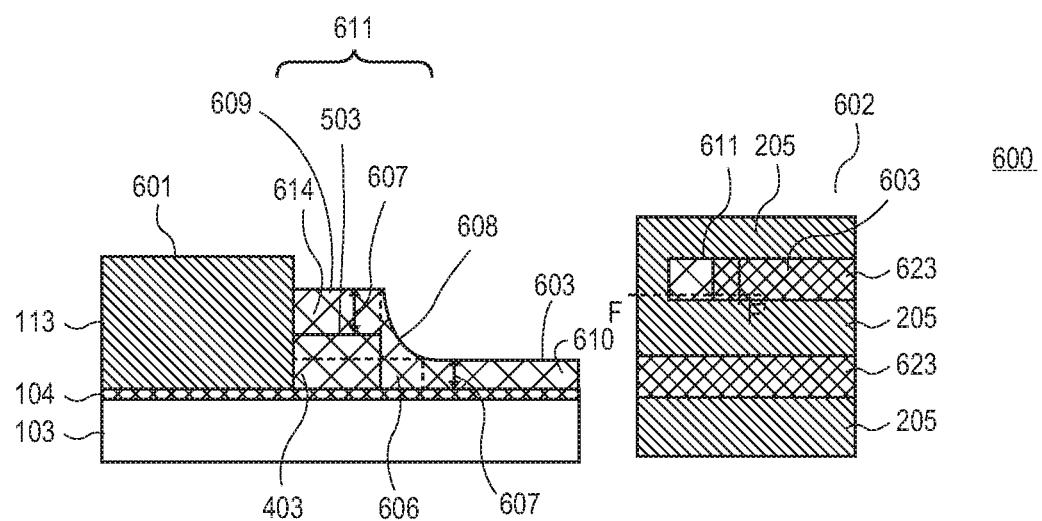
FIG. 6 is a view similar to FIG. 5, after a second conductive layer is deposited onto the first conductive layer and exposed portions of the seed layer according to one embodiment.

FIG. 6 is a view similar to FIG. 5, after a conductive layer is deposited onto the conductive layer 403 and exposed portions of the seed layer according to one embodiment. A view 601 is a cross-sectional view along an axis F-F' and a view 602 is a top view of an apparatus 600. As shown in FIG. 6, a conductive layer 603 is deposited onto the portions of open region 505 and simultaneously on top of conductive layer 403. Conductive layer 603 comprises three portions. A first portion, such as portion 610, forms one or more conductive lines, such as conductive lines 623. A second portion of conductive layer 603, such as a portion 609, is deposited directly on top of conductive layer 403. A third portion of conductive layer 603, such as a portion 608, is deposited between regions 609 and 610 and forms a transition region. Examples of the conductive materials that may be used for the conductive layer 603 include, but are not limited to, metals, e.g., copper, tungsten, tantalum, titanium, hafnium, zirconium, aluminum, silver, tin, lead, metal alloys, metal carbides (e.g., hafnium carbide, zirconium carbide, titanium carbide, tantalum carbide, aluminum carbide), other conductive materials, or any combination thereof. In more specific embodiment, the conductive layer 603 is a copper layer. In one embodiment, a thickness 607 of the conductive layer 603 is determined by the thickness of the conductive line and is substantially equal in portions 609 and 610. In one embodiment, the thickness 607 is from about 0.5 µm to about 4 µm. In more specific embodiment, thickness 607 is from about 1 µm to about 2 µm. In one embodiment, the thickness of the portion 608 varies with position, with the minimum thickness substantially equal to thickness 607 and the maximum thickness substantially equal to the sum of thickness 607 and thickness 404. In one embodiment, the lateral size of portion 608 is determined by the deposition conditions of conductive layer 603 and is from about 0 µm to about 10 µm. In one more specific embodiment, conductive layer 603 is deposited in an isotropic process, and the lateral size of portion 608 is between about 8 µm and about 12 µm. In an alternative embodiment, conductive layer 603 is deposited in an anisotropic process, and the lateral size of portion 608 is less than 1 µm.

As shown in FIG. 6, conductive layer 603 is deposited while leaving portion 205 intact. In one embodiment, conductive layer 603 is deposited using one of electroplating techniques known to one of ordinary skill in the art of electronic device manufacturing. In more specific embodiment, conductive layer 603 is deposited by an electrolytic plating technique at the conditions such that the remaining portion 205 of the photoresist is not dissolved, e.g., by immersion into a solution of copper (II) sulfate and sulfuric acid at room temperature, used for depositing copper. In alternative embodiments, conductive layer 603 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

As shown in FIG. 6, conductive layer 403, together with portions 609 and 608 of conductive layer 603, collectively form a via-pad structure, such as structure 611. The lower portion of the via-pad structure 611, extending from the top of seed layer 104 up to a height equal to thickness 607, represents the pad, such as pad 606. The upper portion of the via-pad structure 611, extending from the top of the pad 606 to the top of the via-pad structure 611, represents the via, such as via 614. In one embodiment, the height of pad 606 is less than or equal to the height of via 614, in which case the pad and the via each comprise portions of conductive layer 403 and conductive layer 603. In an alternative embodiment, the height of pad 606 is greater than the height of via 614, in which case the pad comprises portions of conductive layer 403 and conductive layer 603, while the via comprises conductive layer 603 only. In one embodiment, portion 609 and portion 610 of conductive layer 603 are adjacent along only one direction, and portion 608 of conductive layer 603 extends only in one direction between portions 609 and 610. In an alternative embodiment, portions 609 and 610 are adjacent along multiple directions, and portion 608 extends in multiple directions between portions 609 and 610.

In one embodiment, where photoresist 105 comprises more than three patterned regions, such as regions 203, 204 and 205, the remaining patterned regions are developed and a conductive layer is deposited in a manner similar to the manner described with respect to FIGS. 1 to 6. Generally, deposition of the conductive layer is additive, so each successive conductive layer deposition operation adds to the height of all uncovered conductive structures.

Figure 7:
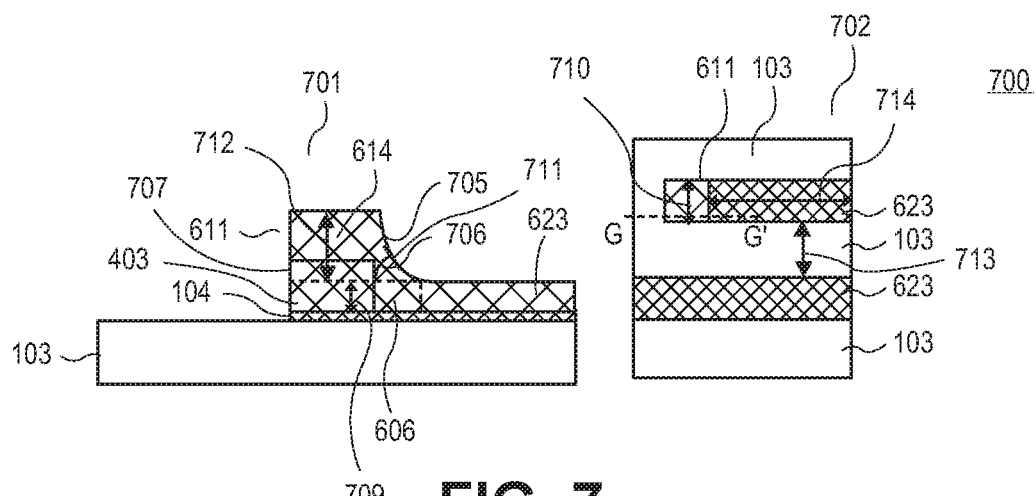
FIG. 7 is a view similar to FIG. 6, after a third region of the photoresist and a portion of the seed layer are removed to expose one or more portions of the substrate according to one embodiment.

FIG. 7 is a view similar to FIG. 6, after a third region of the photoresist and a portion of the seed layer are removed to expose one or more portions of the substrate according to one embodiment. A view 701 is a cross-sectional view along an axis G-G' and a view 702 is a top view of an apparatus 700. Region 205 is removed to expose an underlying portion of the seed layer 104. Subsequently, the underlying portion of the seed layer 104 is removed to define a metal pattern. In one embodiment, region 205 of the photoresist is removed by using one of a stripping solution, an ashing, an etching technique, or any other photoresist removal technique known to one of ordinary skill in the art of electronic device manufacturing. In one embodiment the underlying portion of the seed layer 104 is removed using one of a wet etching, dry etching, or both dry and wet etching techniques known to one of ordinary skill in the art of electronic device manufacturing.

As shown in FIG. 7, via-pad structure 611 comprises via portion 614, pad portion 606, a sidewall 705 and a sidewall 707. As shown in FIG. 7, a tangent 711 to a portion of the sidewall 705 adjacent to conductive line 623 is at an angle 706 other than 90 degrees to an imaginary line 708 extending from the top surface of conductive line 623. Sidewall 707 is substantially perpendicular to imaginary line 708. A height 712 of via portion 614 represents the via height. A height 709 of pad portion 606 represents the pad height.

As shown in views 701 and 702, sidewall 705 extends only along a direction of conductive line 623. The dimensions of the pad portion 606 and the via portion 614 are substantially similar in all directions other than the direction of conductive line 623, so that the misalignment of the pad portion 606 relative to the via portion 614 is effectively eliminated. The extension of sidewall 705 in a direction of conductive line 623 does not affect the I/O density of conductive lines, such as conductive lines 623. That is, the deposition of the conductive layer results in a certain degree of loss of resolution, but only in the direction of the conductive line 623 adjacent to the via portion. The resolution in all directions other than the direction of conductive line 623 is preserved, so that zero-misalignment, sometimes referred to as self-alignment, between the via portion and the pad portion is advantageously achieved. As shown in view 702, the pad is effectively eliminated, as the extent of the pad portion 606 in all directions other than the direction of the conductive line 623 is reduced to the extent of the via portion 614. As shown in view 702, a width 710 of the pad portion 606 is substantially the same as the width of the via portion 614 and the width of the conductive line 623. As shown in FIG. 7, a length 714 of the conductive line 623 attached to the via pad structure 611 is substantially greater than the width 710. In one embodiment, the width 710 is from about 0.5 µm to about 4 µm. In more specific embodiment, width 710 is from about 2 µm to about 3 µm. As shown in FIG. 7, conductive lines 623 are separated by a spacing 713. In one embodiment, spacing 713 is from about 0.5 µm to about 4 µm. In more specific embodiment, spacing 713 is from about 2 µm to about 3 µm.

In one non-limiting example, forming zero-misalignment via-pad structures as described herein that have about 2 µm wide vias on about 2 µm wide pads increases the density of IO connections to about 250/mm/layer that is unprecedented in organic packaging.

Figure 8:
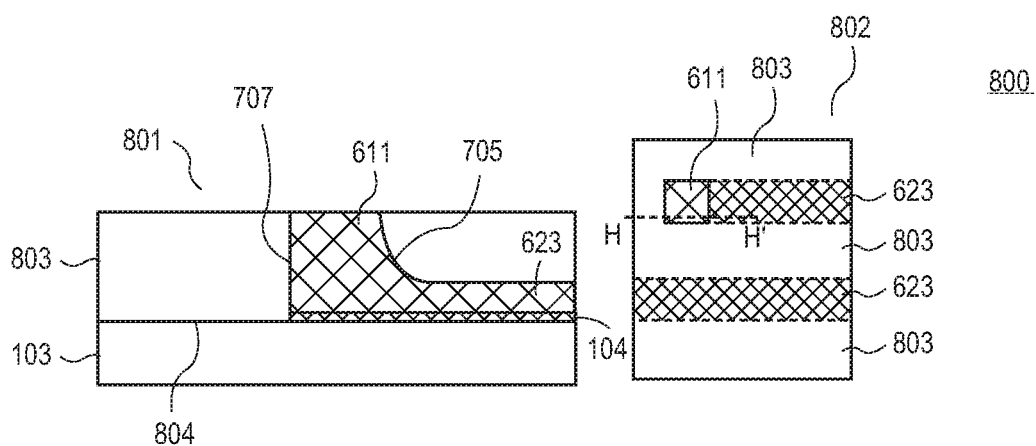
FIG. 8 is a view similar to FIG. 7, after an insulating layer is deposited including onto the via-pad structure and exposed portions of the substrate according to one embodiment.

FIG. 8 is a view similar to FIG. 7, after an insulating layer is deposited onto the via-pad structure 611 and exposed portions of substrate 103 according to one embodiment. A view 801 is a cross-sectional view along an axis H-H' and a view 802 is a top view of an apparatus 800. As shown in FIG. 8, an insulating layer 803 is deposited on sidewall 707 and sidewall 705 of via-pad structure 611, an exposed portion 804 of substrate 103 and conductive line 623 to insulate conductive features from each other and form a foundation for a subsequent process. As shown in FIG. 8, insulating layer 803 is removed from the top surface of the via-pad structure 611. In one embodiment, insulating layer 803 is a nitride layer, e.g., a silicon nitride, a silicon oxide nitride, or any combination thereof. In another embodiment, insulating layer 803 is an oxide layer, e.g., a silicon oxide, an aluminum oxide, a silicon oxide nitride, or any combination thereof. In yet another embodiment, insulating layer 803 may include polyimide, epoxy, photodefinable materials, such as benzocyclobutene (BCB), WPR-series materials, spin-on-glass, other electrically insulating layer determined by an electronic device design, or any combination thereof.

In one embodiment, insulating layer 803 is deposited using one of blanket deposition techniques, such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other insulating deposition techniques known to one of ordinary skill in the art of electronic device manufacturing. In one embodiment, insulating layer 803 is removed from the top surface of the via-pad structure 611 using one of an etching technique, a chemical-mechanical planarization (CMP) technique, or both, as known to one of ordinary skill in the art of electronic device manufacturing. In one embodiment, the insulating layer 803 is deposited to the thickness that is equal or greater than the height of the via-pad structure 611. In another embodiment, the insulating layer 803 is deposited to the thickness that is less than the height of the via-pad structure 611. In one embodiment, the thickness of the insulating layer is from about 0.5 µm to about 6 µm. In more specific embodiment, the thickness of the insulating layer 803 is from about 2 µm to about 4 µm.

Figure 9:
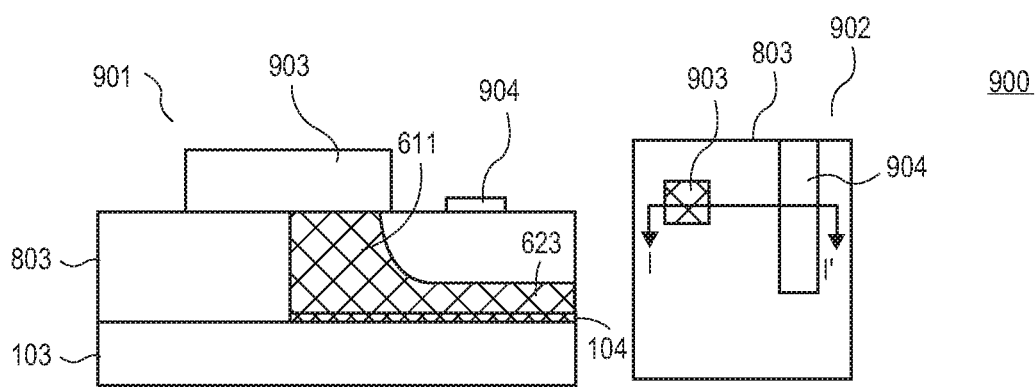
FIG. 9 is a view similar to FIG. 8, after a device layer is deposited onto the insulating layer and an exposed portion of the via-pad structure according to one embodiment.

FIG. 9 is a view similar to FIG. 8, after a device layer is deposited onto the insulating layer 803 and an exposed portion of the via-pad structure 611 according to one embodiment. A view 901 is a cross-sectional view along an axis I-I' and a view 902 is a top view of an apparatus 900. As shown in FIG. 9, a device layer comprises a device feature 903 and a device feature 904. In alternative embodiments, each of the device features 903 and 904 can be deposited using one of device feature depositing techniques, e.g., electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. As shown in FIG. 9, device feature 903 is deposited on top of the via-pad structure 611. In one embodiment, device feature 903 is a device contact, e.g., a chip bump. In one embodiment, device feature 904 is a part of a conductive line. In alternate embodiments, each of the device features 903 and 904 is a part of an electronic device, e.g., a transistor, a memory, a capacitor, a switch, a resistor, an inductor, a voltage regulator, an amplifier, a power management integrated circuit, other electronic device, or any combination thereof.

Figure 10:
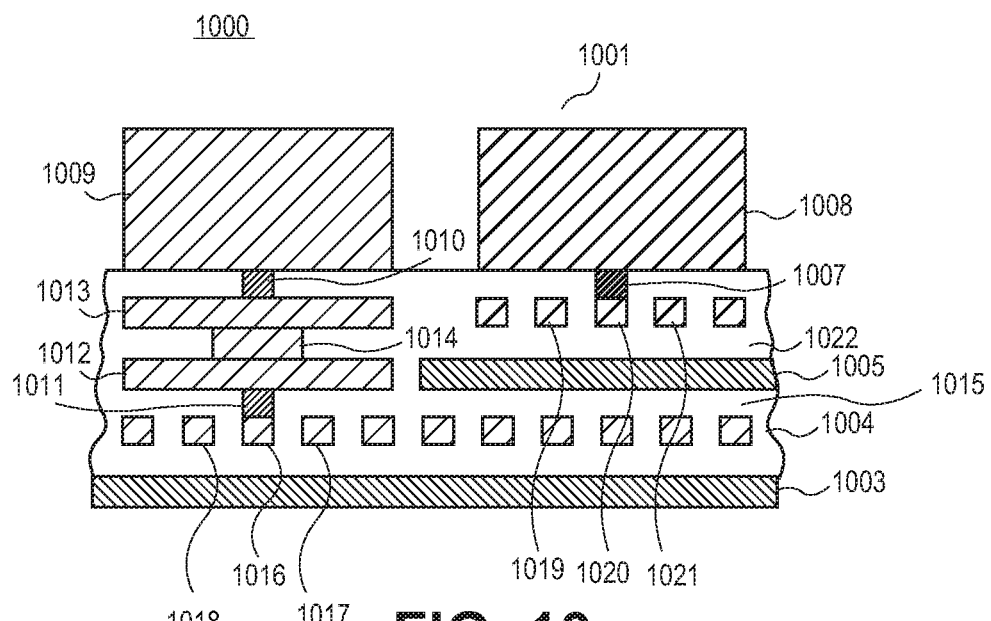
FIG. 10 shows a side view of a portion of an electronic device package comprising a zero-misaligned via-pad structure according to one embodiment.

FIG. 10 shows a side view 1000 of a portion of an electronic device package 1001 comprising a zero-misaligned via-pad structure according to one embodiment. Electronic device package 1001 comprises a routing layer 1004 on an insulating layer 1015 on a substrate 1003 and a routing layer 1006 on an insulating layer 1022 on a substrate 1005. Substrate 1005 is formed over routing layer 1004. In one embodiment, each of the substrates 1003 and 1005 comprises a metal layer, e.g., a ground plane or a power plane. Each of the insulating layer 1015 and insulating layer 1022 represents one of the insulating layers, as described above. In one embodiment, routing layer 1004 is a strip line routing layer. In another embodiment, routing layer 1004 is another electronic device routing layer. In one embodiment, routing layer 1006 is a microstrip routing layer. In another embodiment, routing layer 1006 is another electronic device routing layer. Generally, each of a strip line and a microstrip refers to a type of an electrical transmission line. Typically, a strip line comprises a metal trace sandwiched between two parallel metal planes. A microstrip comprises a conducting trace separated from a ground metal plane by an insulating layer.

Routing layer 1004 comprises a plurality of conductive lines, such as conductive lines 1016, 1017 and 1018. A conductive line 1016 is connected through a via-pad structure 1011 to a metal layer 1012. In one embodiment, metal layer 1012 is a pad associated with via pad structure 1011 and a conductive portion 1014. In another embodiment, metal layer 1012 is another electronic device metal layer. In one embodiment, via-pad structure 1011 is a zero-misaligned via-pad structure, as described above. In one embodiment, via-pad structure 1011 comprises a bleed out sidewall that extends only in a direction of conductive line 1016, but not in other directions, e.g., a direction towards line 1017, or a direction towards line 1018, as described above. As shown in FIG. 10, metal layer 1012 is connected through conductive portion 1014 to a metal layer 1013. In one embodiment, conductive portion 1014 is a metal via. In another embodiment, conductive portion 1014 is a metal interconnect, or other electronic device. In one embodiment, metal layer 1013 is a pad associated with conductive portion 1014 and a via 1010. In another embodiment, metal layer 1013 is another electronic device metal layer. Metal layer 1013 is connected through a via 1010 to a conductive bump 1009. In one embodiment, conductive bump 1009 is a strip line bump. In another embodiment, conductive bump 1009 is an integrated circuit die bump. In one embodiment, a plurality of vias, such as via 1010 are used to connect to strip line bumps at a surface of the electronic device package at relatively coarse pitch, e.g., 40 µm pitch. Routing layer 1006 comprises a plurality of conductive lines, e.g., conductive lines 1019, 1020 and 1021. Conductive line 1020 is connected through a via-pad structure 1007 to a conductive bump 1008. In one embodiment, conductive bump 1008 is a microstrip bump. In another embodiment, conductive bump 1008 is an integrated circuit die bump. In one embodiment, via-pad structure 1007 is a zero-misaligned via-pad structure, as described above. In one embodiment, via-pad structure 1007 comprises a bleed out sidewall that extends only in a direction of line 1020, but not in other directions, e.g., a direction towards line 1019, a direction towards line 1021, as described above.

Figure 11:
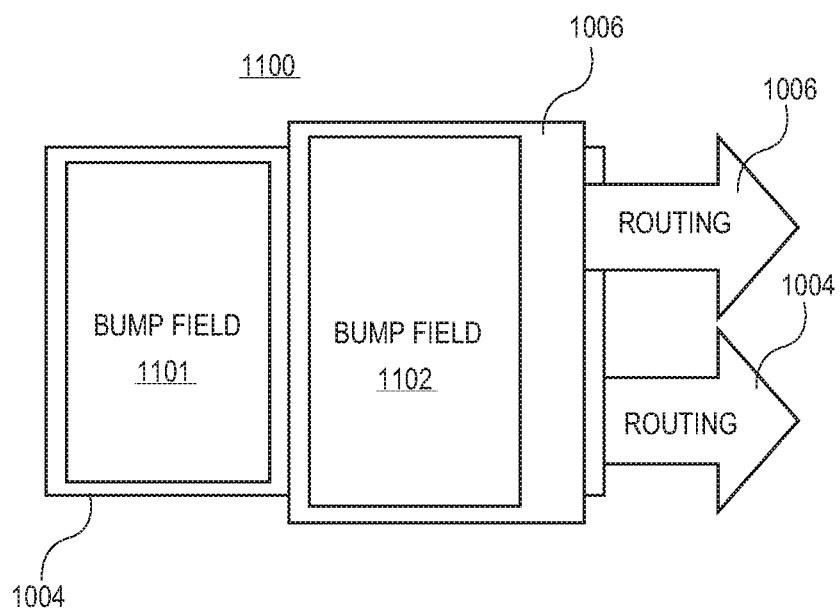
FIG. 11 shows a top view of a portion of the electronic device package comprising the zero-misaligned via-pad structure as described with respect to FIG. 10.

FIG. 11 shows a top view 1100 of a portion of the electronic device package 1001 comprising the zero-misaligned via-pad structure as described with respect to FIG. 10. A portion of the electronic device package 1001 comprises a bump field 1101 and a bump field 1102. In one embodiment, bump field 1101 is a strip line bump field to connect to a strip line. In another embodiment, bump field 1101 is an integrated circuit die bump field to connect to a die. In one embodiment, bump field 1102 is a microstrip bump field to connect to a microstrip. In another embodiment, bump field 1102 is another integrated circuit die bump field to connect to a die. Bump field 1101 comprises one or more conductive bumps, such as conductive bump 1009 over routing layer 1004, as described with respect to FIG. 10. Bump field 1102 comprises one or more conductive bumps, such as conductive bump 1008 over routing layer 1006, as described with respect to FIG. 10. As shown in FIG. 11, bump field 1101 and bump field 1102 do not overlap. The conductive lines of the routing layer 1004 are routed under bump field 1102, as shown in FIG. 11. In one embodiment, routing under large pads/bumps (e.g., metal layer 1012 and microstrip bump 1008) that are connected to I/O lines (e.g., conductive lines 1016 and 1020) may cause a small amount of additional crosstalk. Zero-misalignment via-pad structures, such as via-pad structures 1011 and 1007 are used to increase I/O connection density, as shown in FIGS. 10 and 11.

Figure 12:
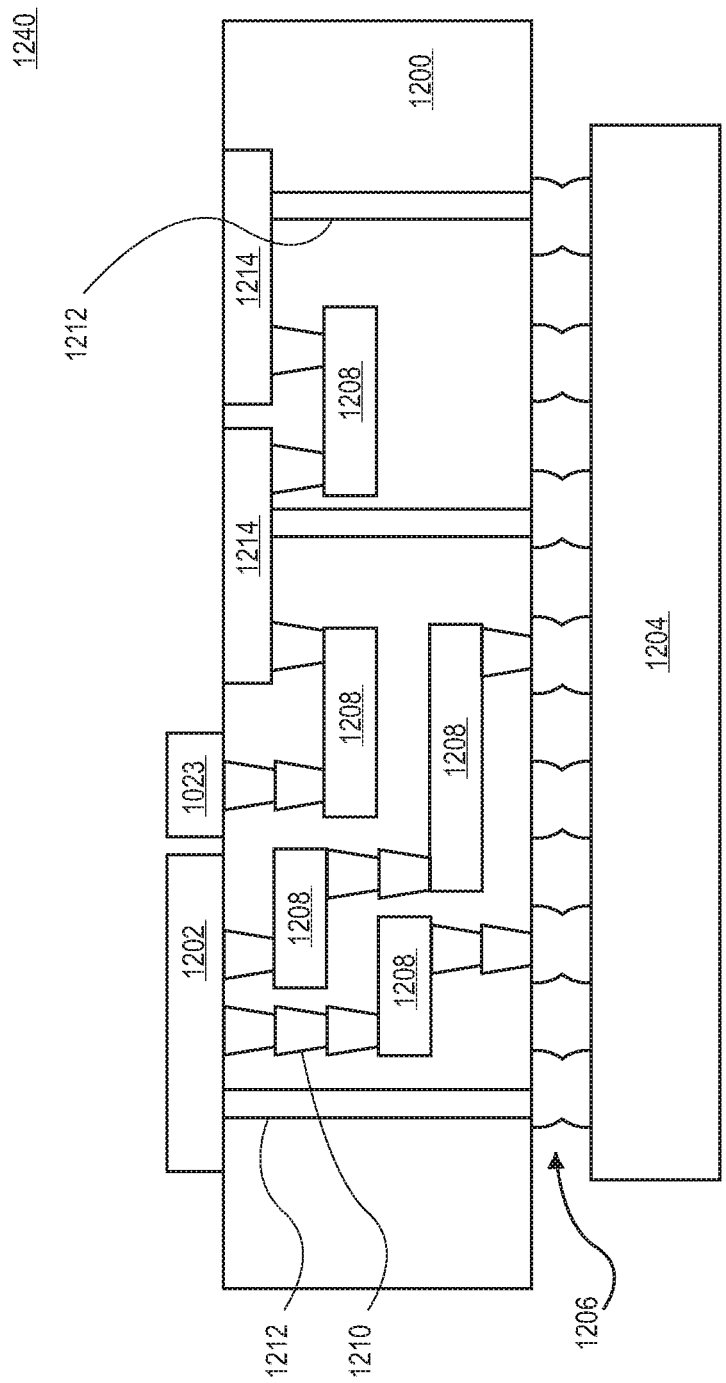
FIG. 12 illustrates an embodiment of an apparatus that includes one or more zero-misalignment via-pad structures, as described herein.

FIG. 12 illustrates an embodiment of an apparatus 1240 that includes one or more zero-misalignment via-pad structures, as described herein. Apparatus 1240 comprises a substrate 1202 and a substrate 1203 deposited on a substrate 1200. Substrate 1200 is deposited on a substrate 1204. Substrate 1204 is coupled to substrate 1200 via package bumps 1206. In one embodiment, substrate 1200 is an electronic device package substrate—e.g., a system-in-package substrate, a multi-chip package substrate, or other electronic device packaging substrate. In one embodiment, each of the substrates 1202 and 1203 is an integrated circuit die, a memory module, a computer motherboard, or an integrated circuit die. In one embodiment, substrate 1204 is a circuit board. In one embodiment, each of the substrates, 1200, 1202, 1203 and 1204 represents one of the substrates as described above.

In another embodiment, substrate 1200 is an interposer substrate to bridge substrates 1202 and 1203 to substrate 1204 to spread a connection to a wider pitch or to reroute a connection to a different connection and each of the substrates 1202, 1203, and 1204 is an integrated circuit die, a memory module, a computer motherboard, or an integrated circuit die. The interposer substrate may be formed of an epoxy resin, a fiberglass-reinforced epoxy resin, a ceramic material, or a polymer material such as polyimide. In further implementations, the interposer may be formed of alternate rigid or flexible materials that may include the materials described above, such as silicon, germanium, and other group III-V and group IV materials. And in further embodiments, three or more substrates are interconnected by way of the interposer substrate 1200. In accordance with embodiments of the invention, apparatuses or processes disclosed herein may be used in the fabrication of substrate 1200.

As shown in FIG. 12, substrate 1200 comprises metal interconnects 1208 and vias 1210, including but not limited to through-silicon vias (TSVs) 1212. At least some of the vias 1210 are part of a zero-misalignment via-pad structure, as described herein. The substrate 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the substrate 1200.

Figure 13:
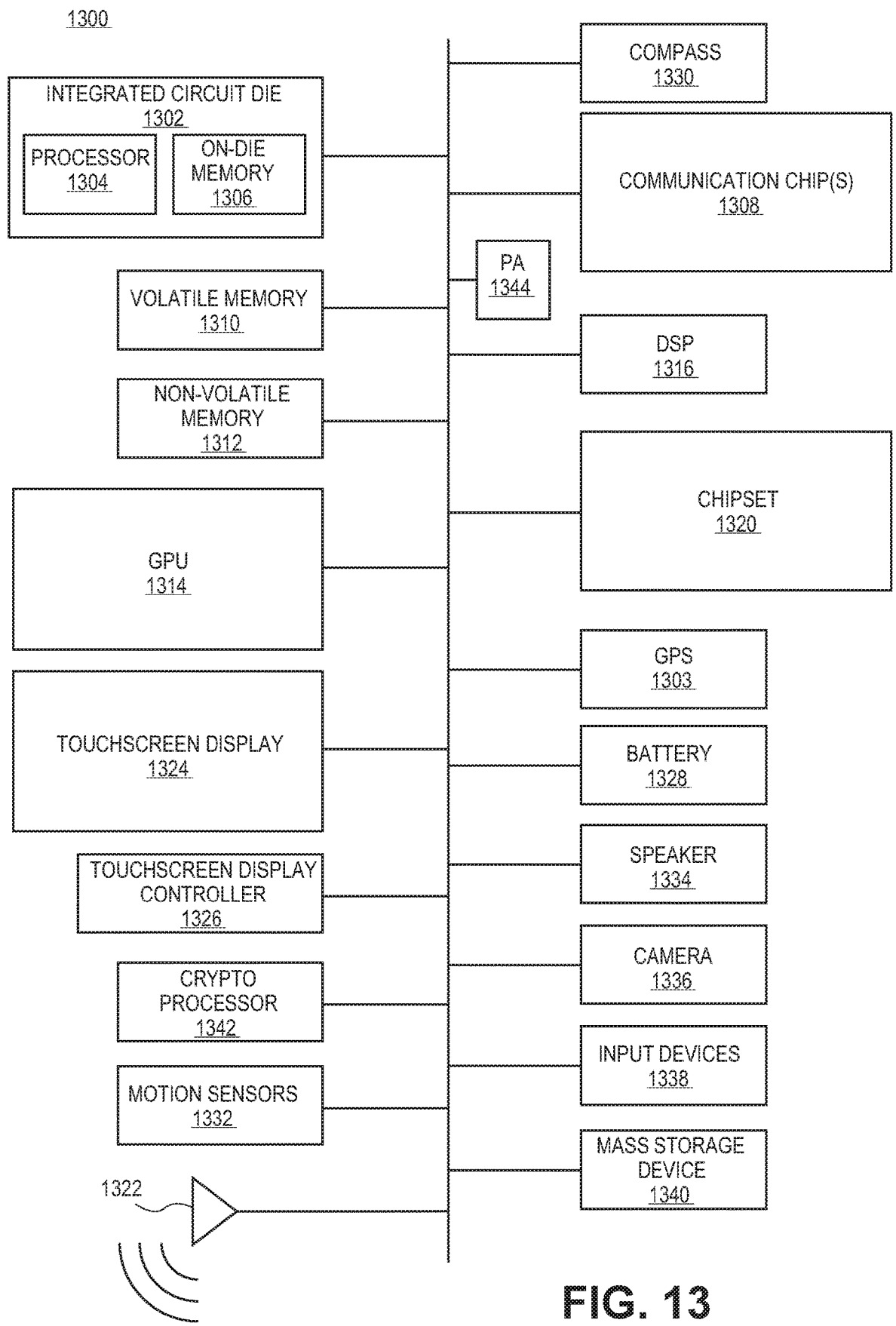
FIG. 13 illustrates a computing device in accordance with one embodiment of the invention.

FIG. 13 illustrates a computing device 1300 in accordance with one embodiment of the invention. The computing device 1300 may include a number of components. In one embodiment, these components are attached to one or more motherboards. In an alternate embodiment, these components are fabricated onto a single system-on-a-chip (SoC) die rather than a motherboard. The components in the computing device 1300 include, but are not limited to, an integrated circuit die 1302 and at least one communication chip 1308. In some implementations the communication chip 1308 is fabricated as part of the integrated circuit die 1302. The integrated circuit die 1302 may include a processor 1304 such as a central processing unit (CPU), an on-die memory 1306, often used as cache memory, that can be provided by technologies such as embedded DRAM (eDRAM) or spin-transfer torque memory (STTM or STTM-RAM).

Computing device 1300 may include other components that may or may not be physically and electrically coupled to the motherboard or fabricated within an SoC die. These other components include, but are not limited to, a volatile memory 1310 (e.g., DRAM), a non-volatile memory 1312 (e.g., ROM or flash memory), a graphics processing unit 1314 (GPU), a digital signal processor 1316 (DSP), a crypto processor 1342 (a specialized processor that executes cryptographic algorithms within hardware), a chipset 1320, an antenna 1322, a display or a touchscreen display 1324, a touchscreen display controller 1326, a battery 1328 or other power source, a power amplifier (PA) 1344, a global positioning system (GPS) device 1303, a compass 1330, a motion coprocessor or sensors 1332 (that may include an accelerometer, a gyroscope, and a compass), a speaker 1334, a camera 1336, user input devices 1338 (such as a keyboard, mouse, stylus, and touchpad), and a mass storage device 1340 (such as hard disk drive, compact disk (CD), digital versatile disk (DVD), and so forth).

The communication chip 1308 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1308. For instance, a first communication chip 1308 may be dedicated to shorter range wireless communications such as Wi-Fi and Bluetooth and a second communication chip 1308 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. A package of the computing device 1300 includes one or more zero-misalignment via-pad structures formed in accordance with embodiments of the invention. A package of one or more components e.g., integrated circuit die 1302, communication chip 1308, GPU 1314, cryptoprocessor 1342, DSP 1316, chipset 1320, and other components may also include one or more zero-misalignment via-pad structures formed in accordance with embodiments of the invention. In further embodiments, another component housed within the computing device 1300 may contain one or more zero-misalignment via-pad structures formed in accordance with embodiments of the invention.

In various embodiments, the computing device 1300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer, wherein the second conductive layer is deposited on a top portion of the first conductive layer and a sidewall portion of the first conductive layer.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer, wherein the first conductive layer is deposited to the thickness smaller than the thickness of the photoresist.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer, wherein the photoresist is a dual tone photoresist.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer, wherein the via-pad structure comprises a lower portion of the first conductive layer that represents a pad, and a first portion of a second conductive layer on an upper portion of the first conductive layer that represents a via portion, and wherein the line comprises a second portion of the second conductive layer on the second portion of the seed layer.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, depositing a second conductive layer onto the first conductive layer and the second portion of the seed layer, removing a third region of the photoresist to expose a third portion of the seed layer, and removing the third portion of the seed layer.

A method to manufacture an electronic device package comprising depositing a photoresist on a seed layer on a substrate, removing a first region of the photoresist to expose a first portion of the seed layer to form a via-pad structure, depositing a first conductive layer onto the first portion, removing a second region of the photoresist adjacent to the first region to expose a second portion of the seed layer to form a line, and depositing a second conductive layer onto the first conductive layer and the second portion of the seed layer, wherein the substrate is an organic substrate.

A method to provide zero misalignment via-pad structures for an electronic device package comprising depositing a seed layer on a substrate, depositing a photoresist on the seed layer, removing a first region of the photoresist to expose a first portion of the seed layer to form a via-pad structure, depositing a first conductive layer onto the first portion, removing a second region of the photoresist to expose a sidewall portion of the first conductive layer and a second portion of the seed layer to form a line, and depositing a second conductive layer on the sidewall portion of the first conductive layer.

A method to provide zero misalignment via-pad structures for an electronic device package comprising depositing a seed layer on a substrate, depositing a photoresist on the seed layer, removing a first region of the photoresist to expose a first portion of the seed layer to form a via-pad structure, depositing a first conductive layer onto the first portion, removing a second region of the photoresist to expose a sidewall portion of the first conductive layer and a second portion of the seed layer to form a line, and depositing a second conductive layer on the sidewall portion of the first conductive layer, wherein the first conductive layer is deposited to the thickness smaller than the thickness of the photoresist.

A method to provide zero misalignment via-pad structures for an electronic device package comprising depositing a seed layer on a substrate, depositing a photoresist on the seed layer, removing a first region of the photoresist to expose a first portion of the seed layer to form a via-pad structure, depositing a first conductive layer onto the first portion, removing a second region of the photoresist to expose a sidewall portion of the first conductive layer and a second portion of the seed layer to form a line, and depositing a second conductive layer on the sidewall portion of the first conductive layer, wherein the via-pad structure comprises a lower portion of the first conductive layer that represents a pad portion, and a first portion of a second conductive layer on an upper portion of the first conductive layer that represents a via portion, and wherein the line comprises a second portion of the second conductive layer on the second portion of the seed layer.

A method to provide zero misalignment via-pad structures for an electronic device package comprising depositing a seed layer on a substrate, depositing a photoresist on the seed layer, exposing a first region of the photoresist to at least a first wavelength, exposing a second region of the photoresist to at least a second wavelength, removing the first region of the photoresist to expose a first portion of the seed layer to form a via-pad structure, depositing a first conductive layer onto the first portion, removing the second region of the photoresist to expose a sidewall portion of the first conductive layer and a second portion of the seed layer to form a line, and depositing a second conductive layer on the sidewall portion of the first conductive layer.

A method to provide zero misalignment via-pad structures for an electronic device package comprising depositing a seed layer on a substrate, depositing a photoresist on the seed layer, exposing a first region of the photoresist to a first light intensity or dose, exposing a second region of the photoresist to a second light intensity or dose, removing the first region of the photoresist to expose a first portion of the seed layer to form a via-pad structure, depositing a first conductive layer onto the first portion, removing the second region of the photoresist to expose a sidewall portion of the first conductive layer and a second portion of the seed layer to form a line, and depositing a second conductive layer on the sidewall portion of the first conductive layer.

A method to provide zero misalignment via-pad structures for an electronic device package comprising depositing a seed layer on a substrate, depositing a photoresist on the seed layer, removing a first region of the photoresist to expose a first portion of the seed layer to form a via-pad structure, depositing a first conductive layer onto the first portion, removing a second region of the photoresist to expose a sidewall portion of the first conductive layer and a second portion of the seed layer to form a line, depositing a second conductive layer on the sidewall portion of the first conductive layer, removing a third region of the photoresist to expose a third portion of the seed layer, and removing the third portion of the seed layer.

An apparatus to manufacture an electronic device package comprising a via-pad structure over a first portion of a seed layer on a substrate, a line adjacent to the via-pad structure over a second portion of a substrate, wherein the via-pad structure comprises a lower portion of a first conductive layer that represents a pad portion, and a first portion of a second conductive layer on an upper portion of the first conductive layer that represents a via portion, and wherein the via portion comprises a sidewall extending in a direction of the line.

An apparatus to manufacture an electronic device package comprising a via-pad structure over a first portion of a seed layer on a substrate, a line adjacent to the via-pad structure over a second portion of a substrate, wherein the via-pad structure comprises a lower portion of a first conductive layer that represents a pad portion, and a first portion of a second conductive layer on an upper portion of the first conductive layer that represents a via portion, and wherein the line comprises a second portion of the second conductive layer over the second portion of the substrate.

An apparatus to manufacture an electronic device package comprising a via-pad structure over a first portion of a seed layer on a substrate, a line adjacent to the via-pad structure over a second portion of a substrate, wherein the via-pad structure comprises a lower portion of a first conductive layer that represents a pad portion, and a first portion of a second conductive layer on an upper portion of the first conductive layer that represents a via portion, wherein the seed layer is deposited between at least one of the first conductive layer and the second conductive layer and the substrate.

An apparatus to manufacture an electronic device package comprising a via-pad structure over a first portion of a seed layer on a substrate, a line adjacent to the via-pad structure over a second portion of a substrate, wherein the via-pad structure comprises a lower portion of a first conductive layer that represents a pad portion, and a first portion of a second conductive layer on an upper portion of the first conductive layer that represents a via portion, wherein at least one of the first conductive layer and the second conductive layer comprises copper.

An apparatus to manufacture an electronic device package comprising a via-pad structure over a first portion of a seed layer on a substrate, a line adjacent to the via-pad structure over a second portion of a substrate, wherein the via-pad structure comprises a lower portion of a first conductive layer that represents a pad portion, and a first portion of a second conductive layer on an upper portion of the first conductive layer that represents a via portion, wherein a size of the pad portion and the size of the via portion are substantially similar.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure, wherein a lower portion of the first conductive layer represents a pad, and the first portion of the second conductive layer on an upper portion of the first conductive layer represents a via portion.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure, wherein the via-pad structure comprises a via sidewall extending in a direction of the line.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure, wherein at least one of the first conductive layer and the second conductive layer comprises copper.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure, and a strip line coupled to the via-pad structure.

An apparatus to provide zero misalignment via-pad structures for an electronic device package comprising a via-pad structure comprising a first conductive layer on a first portion of a seed layer on a substrate and a first portion of a second conductive layer on the first conductive layer, a line comprising a second portion of the second conductive layer on a second portion of the seed layer on the substrate adjacent to the via-pad structure, and a microstrip coupled to the via-pad structure.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An apparatus, comprising
a via-pad structure over a substrate; and
a conductive line adjacent to the via-pad structure over a second portion of a substrate, wherein the via-pad structure comprises:
a lower portion of a first conductive layer that represents a pad portion, and a first portion of a second conductive layer on an upper portion of the first conductive layer that represents a via portion, wherein a width of the pad portion, a width of the via portion, and a width of the conductive line are substantially similar.

2. The apparatus of claim 1, wherein the via portion comprises a sidewall extending in a direction of the conductive line.

3. The apparatus of claim 1, wherein the conductive line comprises a second portion of the second conductive layer over the second portion of the substrate.

4. The apparatus of claim 1, wherein the via-pad structure is over a first portion of a seed layer on the substrate, wherein the seed layer is deposited between at least one of the first conductive layer and the second conductive layer and the substrate.

5. The apparatus of claim 1, wherein at least one of the first conductive layer and the second conductive layer comprises copper.

6. An apparatus, comprising:
a via-pad structure comprising: a first conductive layer on substrate, wherein a lower portion of the first conductive layer represents a pad portion; and
a first portion of a second conductive layer on an upper portion of the first conductive layer represents a via portion; and
a conductive line comprising a second portion of the second conductive layer over the substrate adjacent to the via-pad structure, wherein a width of the pad portion, a width of the via portion, and a width of the conductive line are substantially similar.

7. The apparatus of claim 6, wherein the via-pad structure comprises a via sidewall extending in a direction of the conductive line.

8. The apparatus of claim 6, wherein at least one of the first conductive layer and the second conductive layer comprises copper.

9. The apparatus of claim 6, further comprising a strip conductive line coupled to the via-pad structure.

10. The apparatus of claim 6, further comprising a microstrip coupled to the via-pad structure.

11. The apparatus of claim 6, wherein the via-pad structure is over a first portion of a seed layer on the substrate, wherein the seed layer is deposited between at least one of the first conductive layer and the second conductive layer and the substrate.

* * * * *